US 8,003,162 B2

(12) United States Patent
Shin et al.

(10) Patent No.: US 8,003,162 B2
(45) Date of Patent: *Aug. 23, 2011

(54) METHOD OF FORMING PHASE CHANGE LAYER USING A GERMANIUM PRECURSOR AND METHOD OF MANUFACTURING PHASE CHANGE MEMORY DEVICE USING THE SAME

(75) Inventors: Woong-chul Shin, Suwon-si (KR); Jae-ho Lee, Yongin-si (KR); Youn-seon Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 764 days.

This patent is subject to a terminal disclaimer.

(21) Appl. No.: 11/979,778

(22) Filed: Nov. 8, 2007

(65) Prior Publication Data
US 2008/0118636 A1     May 22, 2008

(30) Foreign Application Priority Data
Nov. 21, 2006 (KR) .................. 10-2006-0115419

(51) Int. Cl.
*C23C 16/18* (2006.01)
*C23C 16/22* (2006.01)
*H01L 21/20* (2006.01)

(52) U.S. Cl. ............ 427/123; 427/124; 427/126.1; 427/250; 427/255.35; 438/478; 438/382

(58) Field of Classification Search ............. 427/123, 427/124, 250, 126.1, 255.35, 478, 382
See application file for complete search history.

(56) References Cited

U.S. PATENT DOCUMENTS
5,510,502 A * 4/1996 Sugano et al. ............. 556/11
(Continued)

FOREIGN PATENT DOCUMENTS
JP     2001-163924     * 6/2001

OTHER PUBLICATIONS
Dittmar, Kersten, et al., "Cyclopentadienyl Germanes as Novel Precursors for the CVD of Thin Germanium Films". Chem. Vap. Deposition 2001, 7, No. 5, pp. 193-195.*

(Continued)

*Primary Examiner* — Bret Chen
(74) *Attorney, Agent, or Firm* — Harness, Dickey & Pierce, P.L.C.

(57) ABSTRACT

A method of forming a phase change layer using a Ge compound and a method of manufacturing a phase change memory device using the same are provided. The method of manufacturing a phase change memory device included supplying a first precursor on a lower layer on which the phase change layer is to be formed, wherein the first precursor is a bivalent precursor including germanium (Ge) and having a cyclic structure. The first precursor may be a cyclic germylenes Ge-based compound or a macrocyclic germylenes Ge-based, having a Ge—N bond. The phase change layer may be formed using a MOCVD method, cyclic-CVD method or an ALD method. The composition of the phase change layer may be controlled by a deposition pressure in a range of 0.001 torr-10 torr, a deposition temperature in a range of 150° C. to 350° C. and/or a flow rate of a reaction gas in the range of 0-1 slm.

23 Claims, 9 Drawing Sheets

U.S. PATENT DOCUMENTS

| | | | |
|---|---|---|---|
| 2005/0127349 A1* | 6/2005 | Horak et al. | 257/3 |
| 2006/0180811 A1* | 8/2006 | Lee et al. | 257/40 |
| 2008/0075843 A1* | 3/2008 | Kuh et al. | 427/125 |
| 2009/0112009 A1* | 4/2009 | Chen et al. | 556/12 |
| 2009/0124039 A1* | 5/2009 | Roeder et al. | 438/99 |
| 2009/0212280 A1* | 8/2009 | Werner et al. | 257/40 |
| 2009/0215225 A1* | 8/2009 | Stender et al. | 438/102 |
| 2009/0305458 A1* | 12/2009 | Hunks et al. | 438/102 |
| 2009/0324821 A1* | 12/2009 | Pore et al. | 427/250 |

OTHER PUBLICATIONS

Kyrsta, S., et al., "Deposition and characterization of Ge-Sb-Te layers for applications in optical data storage". Applied Surface Science 179 (2001) pp. 55-60.*

Campbell, Kristy A., et al., "Phase-change memory devices with stacked Ge-chalcogenide/Sn-chalcogenide layers". Microelectronics Journal 38 (2007) pp. 52-59.*

Tumanskii, Boris, et al., "Radical Reactions of a Stable N-Heterocyclic Germylene: EPR Study and DFT Calculation". JACS Communications 2005, 127, pp. 8248-8249.*

Fedotova, Ya. V., et al., "Germylene with Chelating Phosphinohydrazide Ligands Ge(NPh-NPh-PPh2)2: Synthesis and Structure". Doklady Chemistry, vol. 396, Part 1, 2004, pp. 92-94. Translated from Doklady Akademii Nauk, vol. 396, No. 1, 2004, pp. 65-67.*

Glidewell, Christopher, et al., "Reactions of Diazo-compounds with the Electron-rich Germylene Ge[N(SiMe3)2]2 . . . " J. Chem. Soc. Dalton Trans. 1987, pp. 2981-2986.*

Yao, Shenglai, et al., "Isomerization of an N-Heterocyclic Germylene to an Azagermabenzen-1-ylidene and Its Coupling to a Unigque Bis(germylene)". Organometallics, vol. 29, No. 21, 2010, pp. 5353-5357.*

* cited by examiner

METHOD OF FORMING PHASE CHANGE LAYER USING A GERMANIUM PRECURSOR AND METHOD OF MANUFACTURING PHASE CHANGE MEMORY DEVICE USING THE SAME

PRIORITY STATEMENT

This application claims the benefit of priority under 35 U.S.C. §119 from Korean Patent Application No. 10-2006-0115419, filed on Nov. 21, 2006, in the Korean Intellectual Property Office, the content of which is incorporated herein by reference in its entirety.

BACKGROUND

1. Field

Example embodiments relate to a method of forming a phase change layer using a Ge precursor which may be deposited at low temperature. Other example embodiments relate to a method of manufacturing a phase change memory device using the same.

2. Description of the Related Art

The resistance of a phase change material varies according to the state of the phase change material. The phase change material may have two states: a crystalline state and an amorphous state. In each state, the phase change material has a different resistance. The two states of the phase change material may reverse according to temperature.

A phase change memory device includes a phase change layer formed of a phase change material for storing bit data.

An example of a conventional phase change material is $Ge_2Sb_2Te_5$ (GST). A GST layer may be formed using a physical vapor deposition (PVD) method. If the GST layer is formed using the PVD method, it may be difficult to control the growth of the GST layer, the deposition speed may be low and densification of the GST layer may decrease.

In order to obtain a higher quality GST layer, a metal organic chemical vapor deposition (MOCVD) method or a cyclic chemical vapor deposition cyclic-CVD) method may be used.

Hereinafter, a conventional method of forming a GST layer in a phase change memory device using a conventional CVD method will be described.

A substrate including a lower layer on which a GST layer is to be formed is loaded into a CVD chamber. The substrate may be heated to a desired disposition temperature. Precursors including metal elements forming the GST layer (e.g., organic metal compound(s) including germanium (Ge), organic metal compound(s) including antimony (Sb) and organic metal compound(s) including tellurium (Te)) may be supplied simultaneously through a shower head to the heated substrate. As the substrate is heated to an appropriate deposition temperature, the supplied precursors are absorbed on the lower layer and decomposed. Metal elements included in the precursors react with the lower layer and the remaining materials in the precursors may be discharged outside of the CVD chamber.

The organic metal compound including Ge may be a quadrivalent compound. The organic metal compound including Ge may have a structure in which four organic ligands are connected to one Ge. The Ge may be located in the center of a tetrahedral. In order to thermally decompose the organic metal compound, a higher temperature may be necessary to heat the organic metal compound because the organic metal compound including Ge is very stable.

The substrate temperature needed to form a GST layer using a conventional CVD method is necessarily high in order that the organic metal compound including Ge may be decomposed. The substrate temperature may need to be substantially greater than 300° C.

In order to increase the integration degree of the phase change memory device, a reset current may be decreased. The reset current may be decreased by filling the GST layer in a narrow contact hole having a diameter of 100 nm or less.

A desired step coverage of the GST layer needs to be secured in the conventional method of forming the GST layer. If using a conventional CVD method, the GST layer needs to be deposited at a substantially low temperature to provide the desired step coverage.

If forming the GST layer using a conventional CVD method, the deposition temperature of the GST layer increases because the organic metal compound including Ge is a quadrivalent, stable compound. It may be difficult to form a GST layer having a desired step coverage to fill a contact hole having a diameter of 100 nm or less.

SUMMARY

Example embodiments relate to a method of forming a phase change layer using a Ge precursor which may be deposited at low temperature. Other example embodiments relate to a method of manufacturing a phase change memory device using the same.

Example embodiments provide a method of forming a phase change layer using a germanium (Ge) precursor which may be deposited at low temperature such that the deposition temperature of a $Ge_2Sb_2Te_5$ (GST) layer may be decreased when forming a GST layer using a CVD method.

According to example embodiments, there is provided a method of forming a phase change layer, the method including supplying a first precursor on a lower layer on which the phase change layer is to be formed, wherein the first precursor is a bivalent precursor including Ge and having a cyclic structure.

Supplying the first precursor may include supplying at least one of a second precursor including antimony (Sb) and a third precursor including tellurium (Te) simultaneously with the first precursor.

According to example embodiments, the method may include purging and supplying at least one of a second precursor including Sb and a third precursor including Te.

According to example embodiments, the first precursor may be at least one of cyclic germylenes Ge-based compound and a macrocyclic germylenes Ge-based compound. The Ge compound may be at least one Ge compound represented by Formulas 1 through 3:

Formula 1

Formula 2

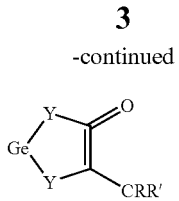

Formula 3 wherein Y is at least one of oxygen, sulfur and phosphorus, R is at least one of hydrogen, alkyl group, allyl group, vinyl group and amino group and R' is at least one of hydrogen, alkyl group, allyl group, vinyl group, amino group and cyano group.

According to example embodiments, the first precursor may be a Ge compound having a Ge—N bond selected from one in the group including a cyclic germylenes Ge-based compound and a macrocyclic germylenes Ge-based compound. The Ge compound may be represented by Formulas 4 through 6:

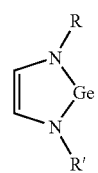

Formula 4

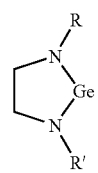

Formula 5

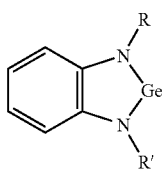

Formula 6 wherein R is at least one of hydrogen, alkyl group, allyl group, vinyl group, amino group, $SiMe_3$ and tBu and R' is at least one of hydrogen, alkyl group, allyl group, vinyl group, amino group and $SiMe_3$.

According to example embodiments, the first precursor may be a Ge compound having a Ge—N bond selected from one in the group including cyclic germylenes Ge-based compounds and a polycyclic germylenes Ge-based compound. The Ge compound may be represented by Formulas 7 and 8:

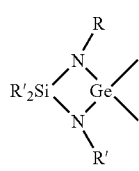

Formula 7

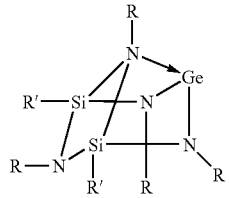

Formula 8 wherein R is at least one of hydrogen, alkyl group, allyl group, vinyl group, amino group, $SiMe_3$ and tBu and R' is at least one of hydrogen, alkyl group, allyl group, vinyl group, amino group and methyl group.

The first precursor may be a Ge compound represented by Formula 9:

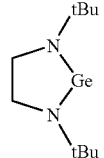

Formula 9

The Ge compound may be formed by synthesizing $GeCl_2$ (dioxane), substituting hydrogen of N,N-di-tert-butylethylenediamine(d-t-beda-$H_2$) with lithium (Li) and reacting the resulting compound with the $GeCl_2$ (dioxane).

The phase change layer may be a GST layer. The phase change layer may be formed using one of a metal organic chemical vapor deposition (MOCVD) method, a cyclic-CVD method and an atomic layer deposition (ALD) method.

A composition of the phase change layer may be controlled by at least one of a deposition pressure, a deposition temperature and a flow rate of a reaction gas.

The deposition pressure may be in a range of 0.001 torr-10 torr. The deposition temperature may be in a range of 150° C.-350° C. The flow rate of the reaction gas may be in an amount of 0 slm-1 slm.

According to example embodiments, there is provided a method of manufacturing a phase change memory device having a storage node having a phase change layer, the method including supplying a first precursor on a lower layer where the phase change layer is to be formed, wherein the first precursor is a bivalent precursor including germanium (Ge) and having a cyclic structure.

BRIEF DESCRIPTION OF THE DRAWINGS

Example embodiments will be more clearly understood from the following detailed description taken in conjunction with the accompanying drawings.

FIGS. 1 through 4 are diagrams illustrating cross-sectional views of a method of manufacturing a phase change memory device according to example embodiments;

FIG. 5 is a diagram illustrating a cross-sectional view of the phase change layer in FIG. 4;

FIG. 6 is a nuclear magnetic resonance (NMR) of a germanium (Ge) compound represented by Formula 9 synthesized according to example embodiments;

FIG. 7 is a graph showing thermal gravimetry-differential scanning calorimetry (TG-DSC) data of a Ge compound represented by Formula 9 synthesized according to example embodiments;

FIGS. 8 through 10 are graphs showing the deposition pressure, the deposition temperature and the flow rate of hydrogen gas of various GST layers formed according to example embodiments;

FIG. 11 is a Scanning Electron Microscope (SEM) image of a $Ge_2Sb_2Te_5$ (GST) layer formed according to example embodiments;

FIG. 12 is a graph showing a diffraction pattern of an X-ray with respect to the GST layer formed according to example embodiments; and FIG. 13 is a graph showing surface analysis of the GST layer formed under the optimum conditions found out experimentally by the inventors of the present invention.

DETAILED DESCRIPTION OF EXAMPLE EMBODIMENTS

Figure 1:
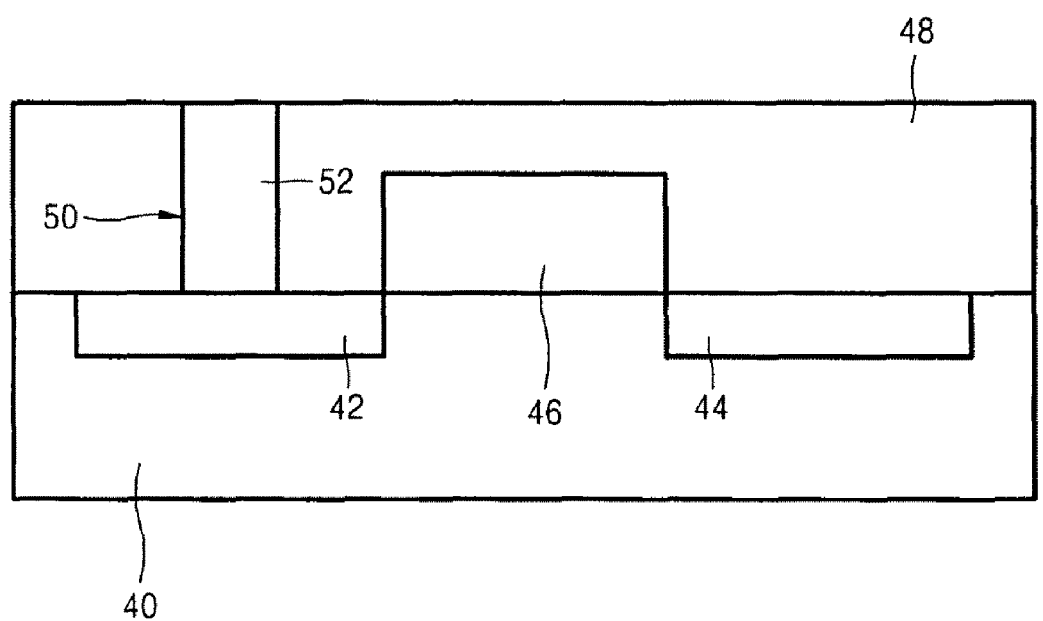
FIGS. 1-13 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected", or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a method of forming a phase change layer using a Ge precursor which may be deposited at low temperature. Other example embodiments relate to a method of manufacturing a phase change memory device using the same.

A method of manufacturing a phase change memory device will be described concurrently with a method of forming a phase change layer in the phase change memory device.

Referring to FIG. 1, a gate stack 46 may be formed in a desired area of an active region that is defined by a device separation layer (not shown) on a p-type or an n-type substrate 40. The gate stack 46 includes a gate insulating layer (not shown) and a gate electrode (not shown). A first impurity region 42 and a second impurity region 44 may be formed in the substrate 40 between the device separation layer and the gate stack 46. The first and second impurity regions 42 and 44 are formed by ion-injecting doping materials opposite in conductivity to that of a doping material of the substrate 40. The first impurity region 42 may be used as a source and the second impurity region 44 may be used as a drain, or vice versa. The first and second impurity regions 42 and 44 may be formed in various shapes. The first region 42, the second impurity region 44 and the gate stack 46 form a semiconductor transistor.

A first insulating interlayer 48 is formed on the substrate 40 over the semiconductor transistor. A contact hole 50 exposing the first impurity region 42 is formed in the first insulating interlayer 48. In other example embodiments, the contact hole 50 may be formed in the first insulating interlayer 48 to expose the second impurity region 44 instead of the first impurity region 42. The contact hole 50 may be filled with a conductive plug 52.

Figure 2:
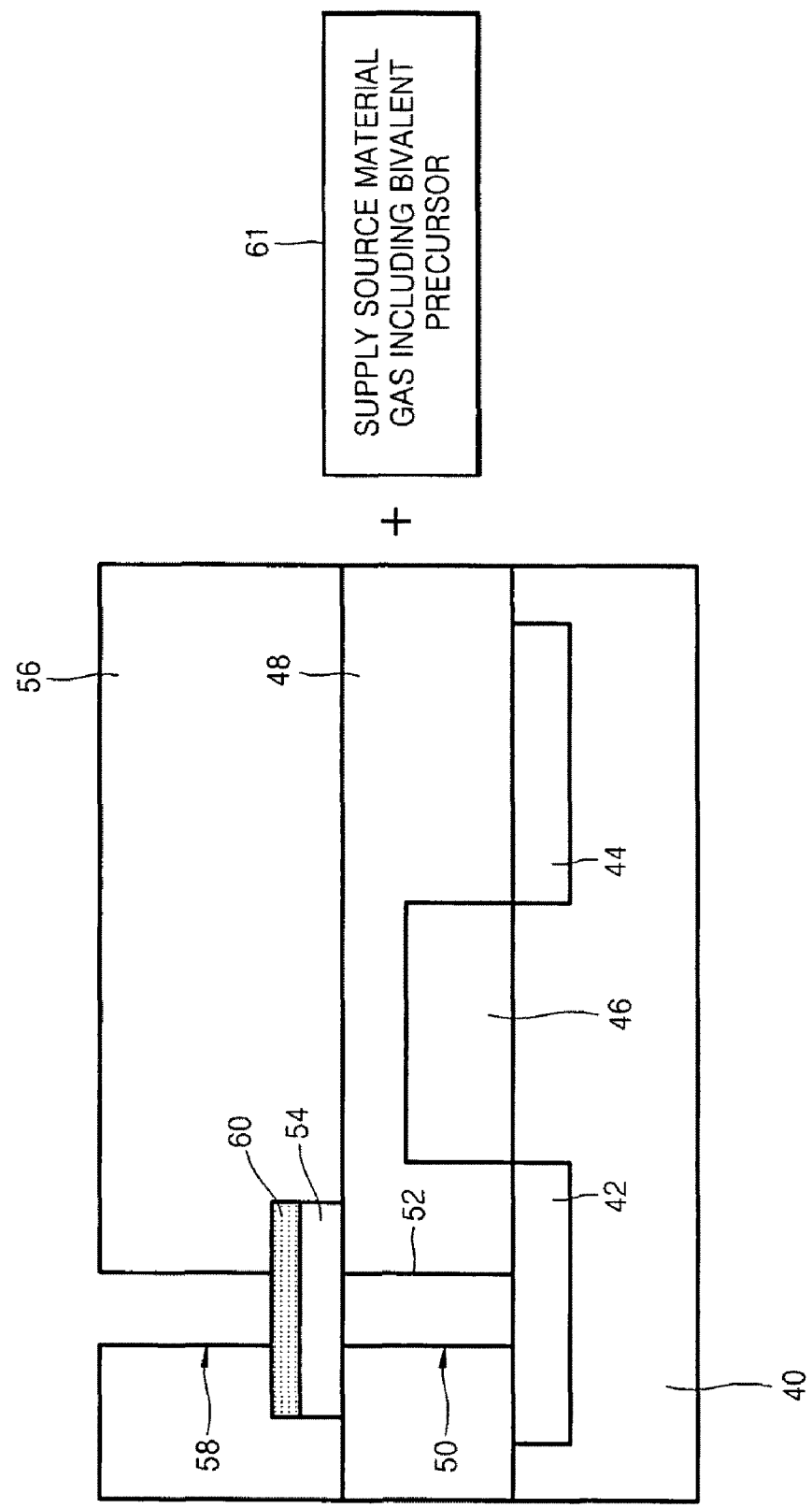

Referring to FIG. 2, a bottom electrode layer 54 is formed on the first insulating interlayer 48 over an exposed upper surface of the conductive plug 52. A bottom electrode contact layer 60 is formed on the bottom electrode layer 54. The bottom electrode layer 54 and the bottom electrode contact layer 60 may be formed by sequentially stacking the bottom electrode layer 54 and the bottom electrode contact layer 60 and simultaneously etching both the bottom electrode layer 54 and the bottom electrode contact layer 60. A second insulating interlayer 56 is formed on the first insulating interlayer 48 over the bottom electrode layer 54 and the bottom electrode contact layer 60. The second insulating interlayer 56 may be formed of the same material as the first insulating interlayer 48. The first insulating interlayer 48 and the second insulating interlayer 56 may be formed of silicon oxide. After the second insulating interlayer 56 is formed, a via hole 58 exposing an upper surface of the bottom electrode contact layer 60 may be formed in the second insulating interlayer 56. A source material gas including a bivalent precursor may be supplied on the second insulating interlayer 56.

Figure 3:
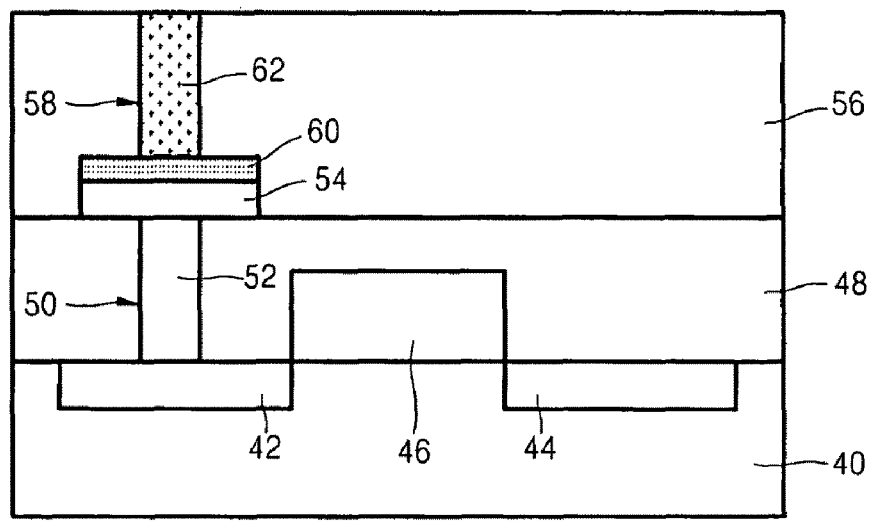

Referring to FIG. 3, a phase change layer 62 may be filled in the via hole 58.

The phase change layer 62 may be formed using a CVD method or an atomic layer deposition (ALD) method. Examples of the CVD method include a metal organic chemical deposition (MOCVD) method and a cyclic-CVD method.

After the substrate 40 is arranged in a deposition chamber, source material gases of the phase change layer 62, a transportation gas (e.g., argon (Ar)), and a reaction gas (e.g., hydrogen ($H_2$)) are supplied on the second insulating interlayer 56 in which the via hole 58 is formed. If the phase change layer 62 is formed using the atomic layer deposition (ALD) method, the $H_2$ gas may be omitted. The phase change layer 62 filling the via hole 58 may be formed in the second insulating interlayer 56. The phase change layer 62 may be planarized using a planarization method (e.g., a chemical mechanical polishing (CMP) method) until the second insulating interlayer 56 is exposed and the phase change layer 62 remains in the via hole 58.

The phase change layer 62 may be a $Ge_2Sb_2Te_5$ (GST) layer. The source material gas may include a first precursor, second precursor and third precursor. The first precursor may be a bivalent precursor including germanium (Ge). The second precursor may include antimony (Sb). The third precursor may include tellurium (Te). The first, second and third precursors may be organic metal compounds. The first precursor may be a bivalent organic metal compound including germanium (Ge).

The phase change layer may include chalcogenide alloys (e.g., germanium-antimony-tellurium (Ge—Sb—Te), arsenic-germanium-antimony-tellurium (As—Ge—Sb—Te) and combinations thereof).

The phase change layers may a binary phase-change chalcogenide alloy or a quaternary phase-change chalcogenide alloy. Example binary phase-change chalcogenide alloys may include one or more of an Ga—Sb alloy, a Ge—Te alloy and combinations thereof. Example quaternary phase-change chalcogenide alloys may include one, or more of a (Ge—Sn)—Sb—Te alloy, a Ge—Sb—(Se—Te), $Te_{81}$—$Ge_{15}$—$Sb_2$—$S_2$ alloy or combinations thereof.

The phase change layer may be made of a transition metal oxide having multiple resistance states. For example, phase change layers may be made of at least one material selected from the group consisting of NiO, $TiO_2$, HfO, $Nb_2O_5$, ZnO, $WO_3$, CoO, $Ge_2Sb_2Te_5$ (GST), PCMO($Pr_xCa_{1-x}MnO_3$) and combinations thereof. The phase change layer may be a chemical compound including one or more elements selected from the group consisting of S, Se, Te, As, Sb, Ge, Sn, In, Ag and combinations thereof.

During formation of the phase change layer 62, the first, second and third precursors may be supplied simultaneously using the MOCVD method. In other example embodiments, each precursor may be sequentially supplied. In yet other example embodiments, two precursors may be supplied simultaneously using the cyclic-CVD method or the ALD method. Unabsorbed precursors on the via hole 58 may be purged after supplying the precursors. If the ALD method is used, the reaction gas may be supplied after the purging process.

If the first, second and third precursors are supplied, the deposition pressure in the deposition chamber may be maintained at 0.001 torr-10 torr. The deposition temperature may be maintained at 150° C.-350° C. The flow rate of the $H_2$ gas may be maintained at 0-1000 sccm (1 slm).

The first precursor may be one of three types of a Ge-based compound.

The first precursor may be at least one of a cyclic germylenes Ge-based compound or a macrocyclic germylenes Ge-based compound. The first precursor may be a Ge-based compound represented by Formulas 1 through 3 below.

Formula 1

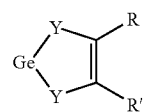

Formula 2

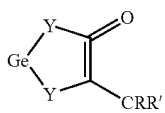

Formula 3

In Formulas 1 through 3, Y may be at least one selected from the group including oxygen, sulfur and phosphorus. R may be at least one selected from the group including hydrogen (H), alkyl group, allyl group, vinyl group and amino group. R' may be at least one selected from the group including hydrogen (H), alkyl group, allyl group, vinyl group, amino group and cyano group.

The first precursor may be a cyclic germylenes Ge-based having a Ge—N bond or a macrocyclic germylenes Ge-based compound including a Ge—N bond. The first precursor may be a Ge-based compound represented by Formulas 4 through 6 below.

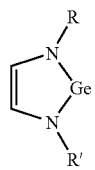

Formula 4

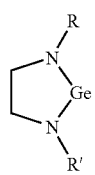

Formula 5

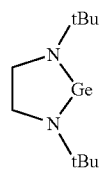

Formula 6 wherein R is at least one selected from the group including hydrogen, alkyl group, allyl group, vinyl group, amino group and $SiMe_3$. R' is at least one selected from the group including hydrogen, alkyl group, allyl group, vinyl group, amino group and $SiMe_3$, wherein "Me" denotes a methyl group, $CH_3$.

The Ge compound represented by Formulas 4 through 6 may be a cyclic compound having a double bond. The Ge compound may be a compound wherein R is a tert-butyl (t-Bu) and R' is $SiMe_3$.

The first precursor may be a Ge-based compound selected from the group including one of two cyclic germylenes Ge-based compounds and a polyocyclic germylenes Ge-based compound. The Ge compound may include a Ge—N bond.

The Ge compound may be selected from one of Formulas 7 and 8 below.

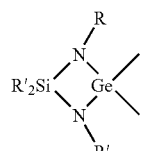

Formula 7

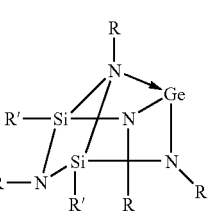

Formula 8

In Formulas 7 and 8, R may be at least one selected from the group including hydrogen, alkyl group, allyl group, vinyl group, amino group and $SiMe_3$. R' may be at least one selected from the group including hydrogen, alkyl group, allyl group, vinyl group and amino group.

The Ge compound represented by Formulas 7 and 8 may be a compound wherein R is t-Bu and R' is a methyl group.

The second and third precursors may be $Sb(iPr)_3$ and $Te(iPr)_2$, respectively, wherein "iPr" denotes an isopropyl group.

If the first precursor is a bivalent organic metal compound, the GST layer may be formed at a substantially lower temperature.

The Ge compound may be represented by Formula 9 (i.e., Ge(II) di-tert-butylethylenediamide) as the first precursor, $Sb(iPr)_3$ as the second precursor and $Te(iPr)_2$ as the third precursor to form a GST layer. "Ge(II)" in Ge(II) di-tert-butylethylenediamide denotes that Ge is bivalent.

In the first precursor represented by Formula 5, R and R' may be t-Bu, as shown in Formula 9 below.

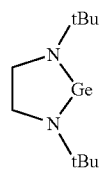

Formula 9

Formula 9 may be synthesized by forming $GeCl_2$(dioxane), substituting H of N,N-di-tert-butylethylenediamine(d-t-beda-$H_2$) with Li and reacting the resulting compound with $GeCl_2$(dioxane).

The above synthesis process may be represented by Chemical Equation 1 below.

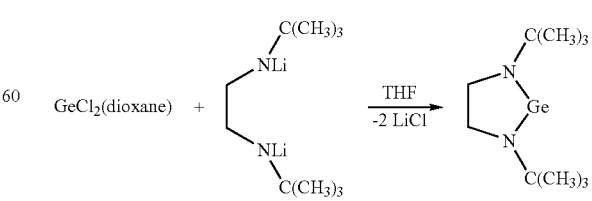

Chemical Equation 1

Figure 6:
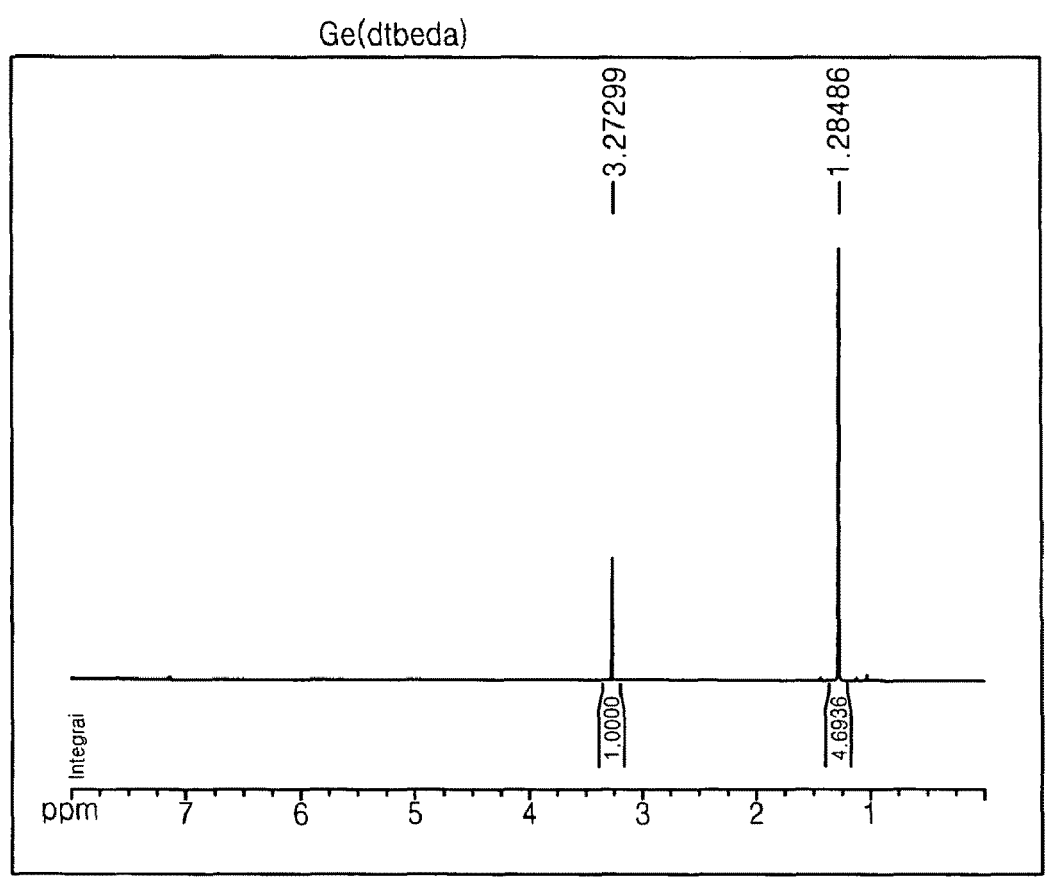
Figure 7:
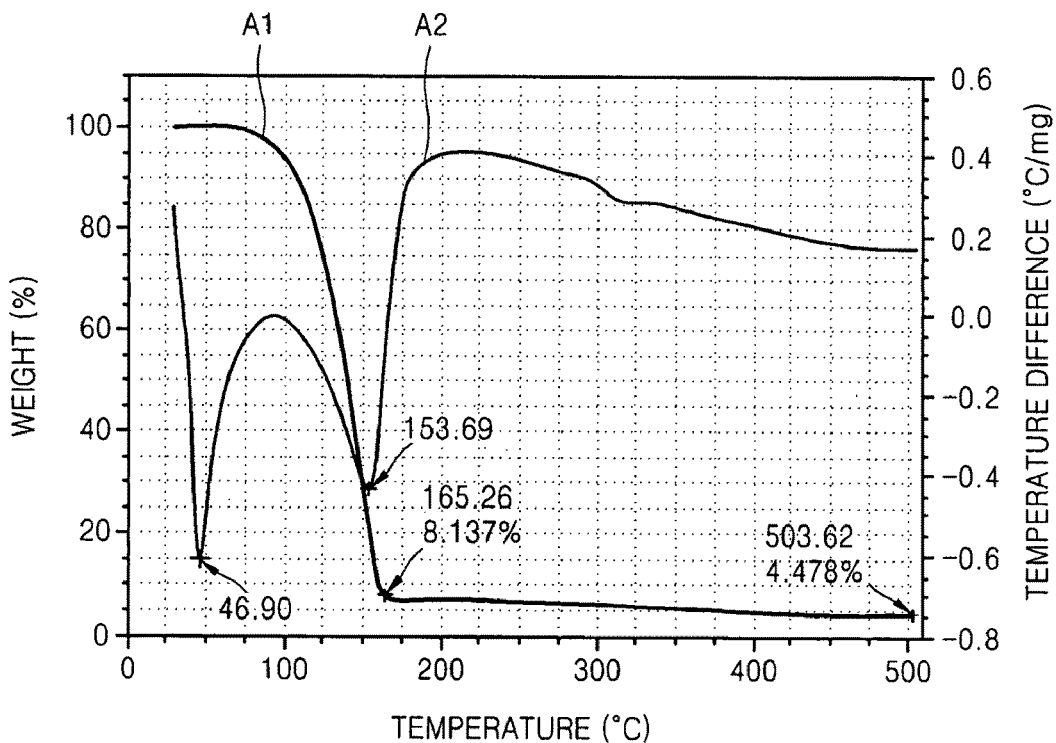

FIG. 6 is a nuclear magnetic resonance (NMR) of Ge(II) di-tert-butylethylenediamide (Formula 9), which was synthesized according to example embodiments. FIG. 7 is a graph showing thermal gravimetry-differential scanning calorimetry (TG-DSC) of Ge(II) di-tert-butylethylenediamide (Formula 9), which was synthesized according to example embodiments.

Referring to FIG. 7, a first graph A1 shows a change in the weight of the Ge compound from liquid to gas. As shown in A1, the Ge compound changes to gas at about 165° C., which is lower than 200° C. A second graph A2 shows a change in the temperature differences of the Ge compound when the phase of the Ge compound changes from liquid to gas. As shown in A2, the change in temperature of the gaseous state of the Ge compound is not substantially large. According to the data shown in FIGS. 6 and 7, the synthesized Ge compound may be deposited at a temperature lower than 300° C.

Figure 8:
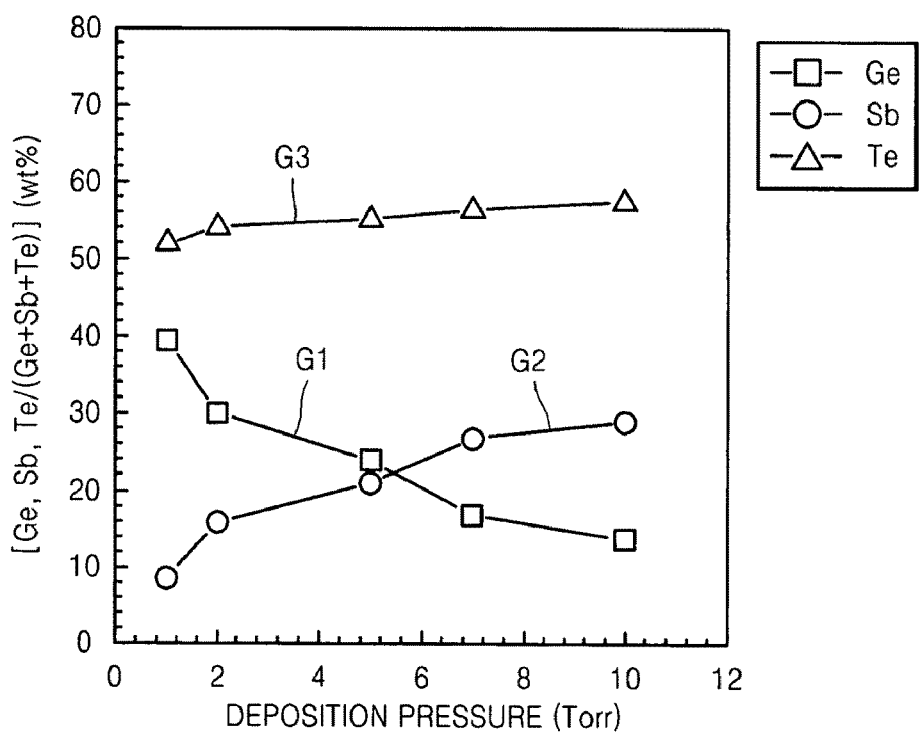
Figure 9:
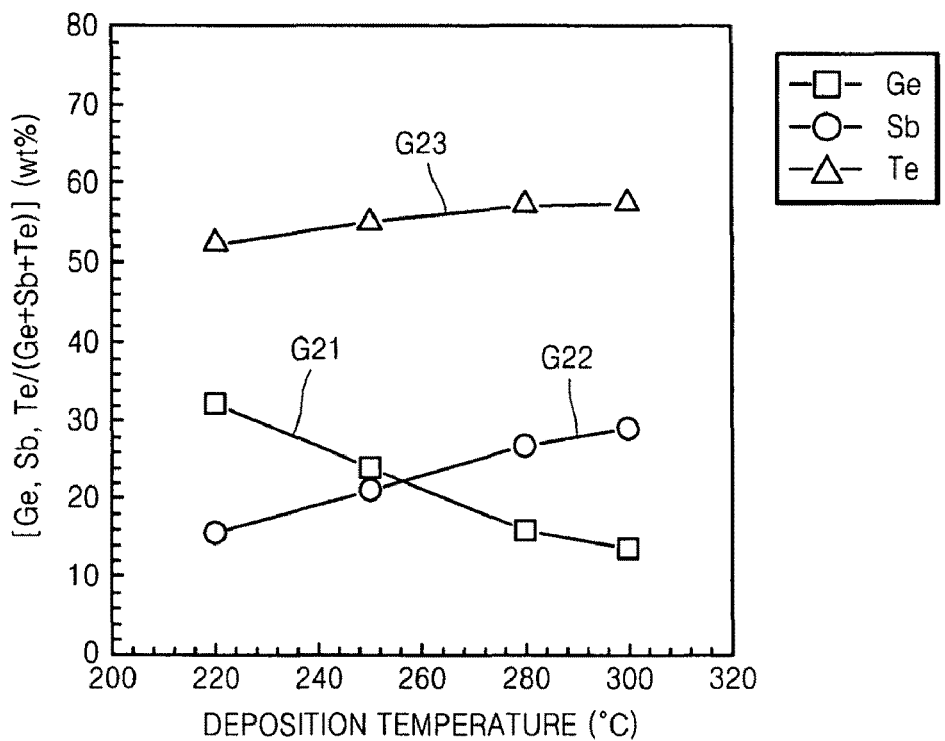
Figure 10:
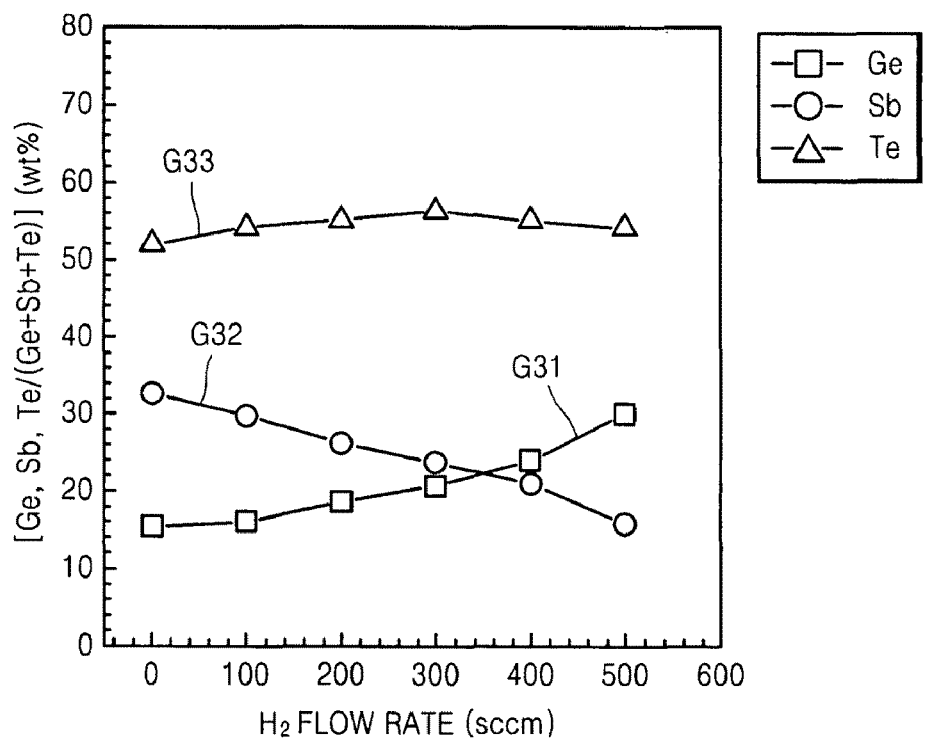

FIGS. 8 through 10 show the results of the first through third experiments performed to determine how the composition of the GST layer formed using the GE-based compound according to example embodiments is affected by changes in the formation conditions.

In the first experiment, the deposition temperature and the hydrogen gas flow rate were maintained at 250° C. and 400 sccm, respectively. In the second experiment, the deposition pressure and the hydrogen gas flow rate were maintained at 5 torr and 400 sccm, respectively. In the third experiment, the deposition temperature and the deposition pressure were maintained at 250° C. and 5 torr, respectively. In experiments 1-3, the flow rate of Ge carriers was maintained at 50 sccm and the substrate was formed of TiN/SiO$_2$/Si.

In each of FIGS. 8-10, graphs G1, G21, and G31 show a change in the amount of Ge in the GST layer, second graphs G2, G22, and G32 show a change in the amount of Sb and third graphs G3, G23, and G33 show a change in the amount of Te.

Referring to FIG. 8, when the deposition temperature and the hydrogen gas flow rate were maintained at 250° C. and 400 sccm, respectively, and the deposition pressure was varied from 1 torr-10 torr, the amount of Te (G3) remained relatively constant at 60 wt %, the amount of Ge (G1) decreased from 40 wt % to 10 wt % and the amount of Sb (G2) increased from 10 wt % and 30 wt %.

Referring to FIG. 9, when the deposition pressure and the hydrogen gas flow rate were maintained at 5 torr and 400 sccm, respectively, and the deposition temperature was varied from 220° C.-300° C., the amount of Ge (G21) decreased from 30 wt % to 10 wt %, the amount of Sb (G22) increased from 10 wt % and 30 wt %, and the amount of Te (G23) increased from 50 wt % and 60 wt %.

Referring to FIG. 10, when the deposition temperature and the hydrogen gas flow rate were maintained at 250° C. and 5 torr, respectively, and the hydrogen gas flow rate was varied from 0-500 sccm, the amount of Ge (G31) increased from about 15 wt % to 30 wt %, the amount of Sb (G32) decreased from a value slightly greater than 30 wt % to 20 wt % or smaller and the amount of Te (G33) remained relatively constant between 50 wt % and 60 wt %.

Comparing FIGS. 8 through 10, the GST layer includes Ge, Sb and Te. A GST layer is formed near Ge$_2$Sb$_2$Te$_5$ under a deposition temperature of 250° C., deposition pressure of 5 torr, hydrogen gas flow rate of 400 sccm and Ge flow rate of 50 sccm.

The results illustrated in FIGS. 8 through 10 were obtained using an inductively coupled plasma-atomic emission spectrometer (ICP-AES).

Figure 11:
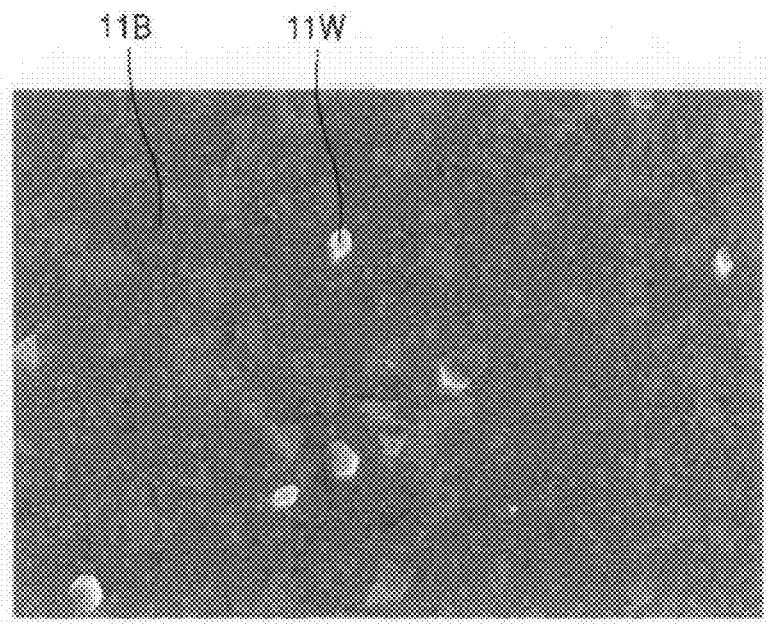

FIG. 11 shows a scanning electron microscope (SEM) image of a GST layer formed according to example embodiments.

Referring to FIG. 11, the black portion 11B is a flat portion having a uniform thickness in the GST layer and the white portion 11W is a portion formed higher than the black portion 11B. A step difference (i.e., the surface roughness) between the black portion 11B and the white portion 11W is about 4.2 nm.

As shown in FIG. 11, a Ge$_2$Sb$_2$Te$_5$ layer having a substantially uniform thickness is formed according to example embodiments.

Figure 12:
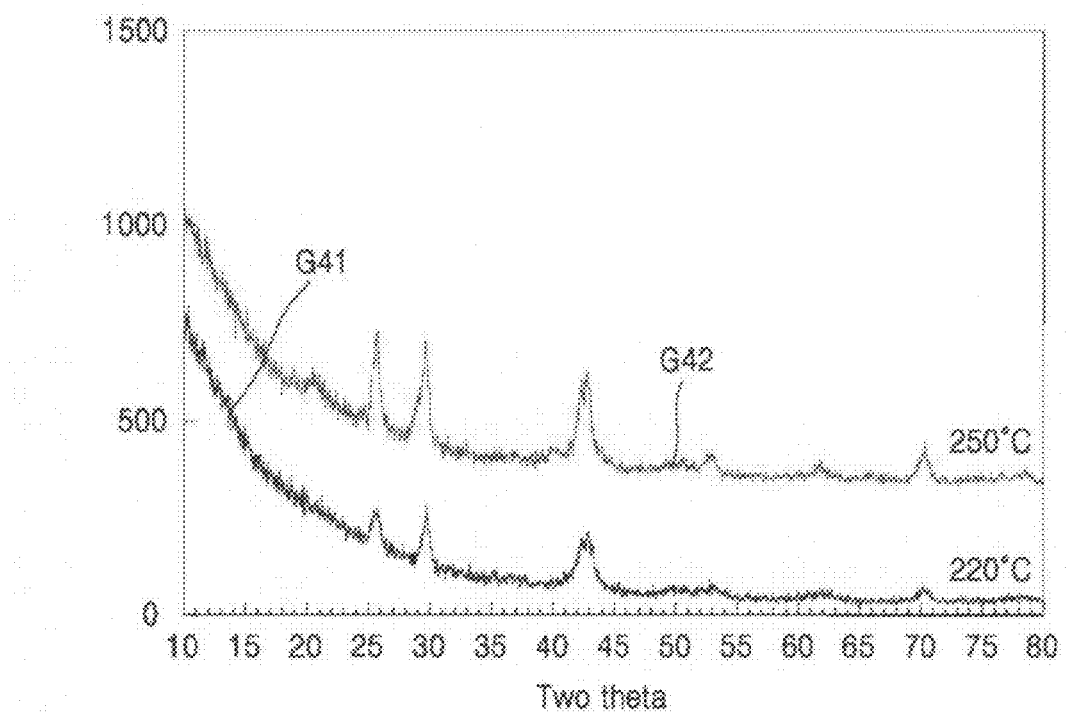

FIG. 12 is an X-ray diffraction pattern of a GST layer formed according to example embodiments.

Referring to FIG. 12, graph G41 shows a GST layer formed at a deposition temperature of 220° C. and graph G42 shows a GST layer formed at a deposition temperature of 250° C. The peaks of graph G41 and graph G42 show an identical pattern. As indicated by the position and pattern of the peaks graphs G41 and G42, the crystal structure of the GST layer is a face-centered cube.

Figure 13:
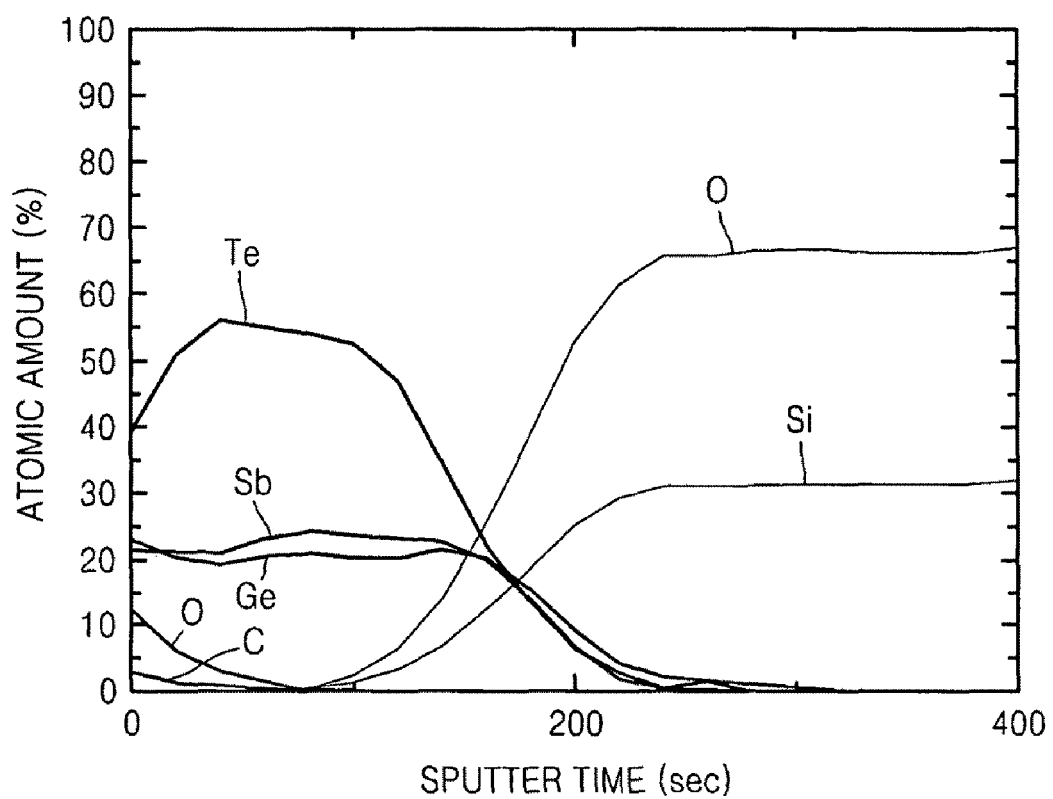

FIG. 13 is a graph showing surface analysis of the GST layer formed according to example embodiments. FIG. 13 was obtained using auger electron spectroscopy (AES).

Referring to FIG. 13, if the sputter time is 50 seconds-100 seconds, oxygen (O) and carbon (C) elements are present at low levels in the GST layer. For example, if the content of carbon and oxygen is low during the sputter time between 50 seconds to 100 seconds, the content of carbon and oxygen are 0.18 atomic % and 1.24 atomic %, respectively.

Figure 4:
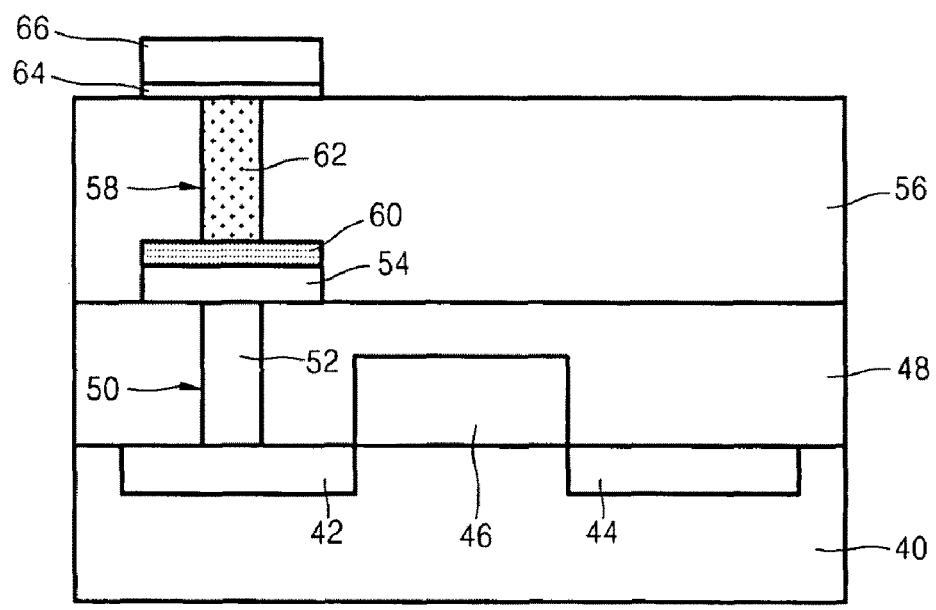

FIG. 4 is a diagram illustrating a method of manufacturing a phase change memory device according to example embodiments.

Referring to FIG. 4, a phase change layer 62 may be formed in a via hole 58. A top electrode contact layer 64 covering the phase change layer 62 may be formed on a second interlayer insulating layer 56. A top electrode layer 66 may be formed on the top electrode contact layer 64.

Figure 5:
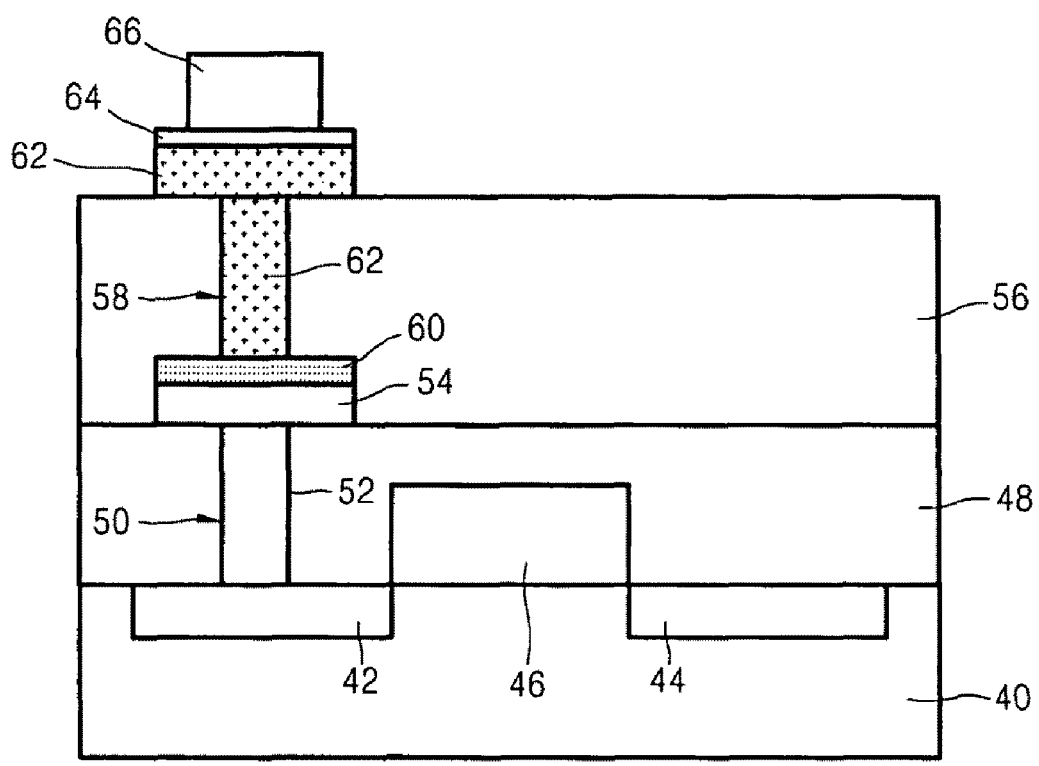

FIG. 5 is a diagram illustrating a cross-sectional view of the phase change layer in FIG. 4 which is extended around the circumference of a via hole.

Referring to FIG. 5, the phase change layer 62 fills the via hole 58. The phase change layer 62 extends over the second interlayer insulating layer 56 around the via hole 58. While the phase change layer 62 is being filled in the via hole 58, the phase change layer 62 may be formed to a desired thickness on the second insulating interlayer 56. A mask covering a region corresponding to the via hole 58 and a portion around the via hole 58 may be formed on the phase change layer 62. The phase change layer 62 around the mask may be removed.

Alternatively, though not illustrated in the drawings, a portion of the via hole 58 (e.g., an intermediate layer of the via hole 58) may be filled with the phase change layer 62. A lower portion of the phase change layer 62 (e.g., the via hole 58 between the phase change layer 62 which fills the intermediate layer of the via hole 58 and the bottom electrode contact layer 52) may be filled with the bottom electrode contact layer 52. The via hole 58 between the phase change layer 62 and the top electrode contact layer 64 may be filled with the top electrode contact layer 64. The via hole 58 may be filled with the bottom electrode contact layer 52, the phase change layer 62 and the top electrode contact layer 64, sequentially.

As shown in FIG. 4, if the phase change layer 62 is formed in the via hole 58 (or if the phase change layer 62 fills a portion of the via hole 58 as described above), the reset current may decrease more than 50%. As such, the integration degree of the phase change memory device may substantially increase.

According to example embodiments, a bivalent organic metal compound may be used as a precursor including Ge. The deposition temperature may be 300° C. or less, or 220°

C.-280° C. in the GST layer formation process using a MOCVD or a cyclic CVD method. The GST layer may have increased step coverage. A phase change memory device, in which GST is filled in the via hole having a diameter of 100 nm or less, may be manufactured. The reset current may decrease in the phase change memory device according to example embodiments. If the reset current decreases, the maximum current through the transistor may decrease and/or the size of the transistor may be decreased. As such, the integration of the phase change memory device may increase.

While the present invention has been particularly shown and described with reference to example embodiments thereof, the example embodiments are for illustrative purpose only and are not intended to limit the scope of the present invention. For example, the method according to example embodiments may be applied to the formation of a phase change layer in a phase change memory device having a different structure than the structure of a storage node illustrated in FIGS. 4 and 5. Thus, the scope of the present invention is not defined by the example embodiments but by the technical scope of the following claims.

What is claimed is:

1. A method of forming a phase change layer, comprising:
supplying a first precursor on a lower layer on which the phase change layer will be formed, the first precursor being a Ge-based compound represented by one of Formulas (1) through (3):

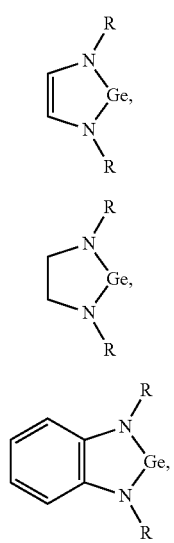

FORMULA (1)

FORMULA (2)

FORMULA (3)

wherein R is at least one selected from the group consisting of hydrogen, alkyl group, allyl group, vinyl group, amino group, SiMe$_3$ and t-Bu, and R' is at least one selected from the group consisting of hydrogen, alkyl group, allyl group, vinyl group, amino group and SiMe$_3$.

2. The method of claim 1, wherein further comprising simultaneously supplying at least one of a second precursor including antimony (Sb) and a third precursor including tellerium (Te) with the first precursor.

3. The method of claim 1, further comprising purging the first precursor; and supplying at least one of a second precursor including antimony (Sb) and a third precursor including tellerium (Te).

4. The method of claim 1, wherein the phase change layer is a GST layer formed using a metal organic chemical vapor deposition (MOCVD) method, a cyclic-CVD method or an atomic layer deposition (ALD) method.

5. The method of claim 1, further comprising forming the phase change layer on the lower layer, wherein adjusting a deposition pressure controls a composition of the phase change layer.

6. The method of claim 5, wherein the deposition pressure is in a range of 0.001 torr-10 torr.

7. The method of claim 1, further comprising forming the phase change layer on the lower layer, wherein adjusting a deposition temperature controls a composition of the phase change layer.

8. The method of claim 7, wherein the deposition temperature is in a range of 150° C.-350° C.

9. The method of claim 1, further comprising forming the phase change layer on the lower layer, wherein adjusting a flow rate of a reaction gas controls a composition of the phase change layer.

10. The method of claim 9, wherein the reaction gas is supplied in an amount of 0-1 slm.

11. The method of claim 1, further comprising:
forming an insulating interlayer on the lower layer; and
forming a hole exposing the lower layer on the interlayer insulating layer, before supplying the first precursor.

12. A method of forming a phase change layer, comprising:
supplying a first precursor on a lower layer on which the phase change layer will be formed, the first precursor being a Ge-based compound represented by one of Formulas (4) and (5):

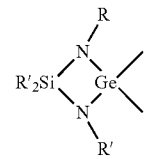

FORMULA (4)

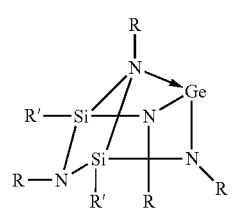

FORMULA (5)

wherein R is at least one selected from the group consisting of hydrogen, alkyl group, allyl group, vinyl group, amino group, SiMe$_3$ and t-Bu, and R' is at least one selected from the group consisting of hydrogen, alkyl group, allyl group, vinyl group, amino group and methyl group.

13. A method of manufacturing a phase change memory device including a method of forming a phase change layer according to claim 1, comprising:
supplying a first precursor on a lower layer on which the phase change layer will be formed,
wherein the phase change memory device includes a storage node having the phase change layer, and
the first precursor is a Ge-based compound represented by one of Formulas (1) through (3):

FORMULA (1)

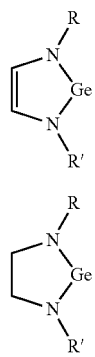

FORMULA (2)

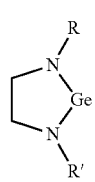

wherein R is at least one selected from the group consisting of hydrogen, alkyl group, allyl group, vinyl group, amino group, SiMe$_3$ and t-Bu, and R' is at least one selected from the group consisting of hydrogen, alkyl group, allyl group, vinyl group, amino group and SiMe$_3$.

14. The method of claim 13, wherein the phase change layer is a Ge$_2$Sb$_2$Te$_5$ (GST) layer formed using a metal organic chemical vapor deposition (MOCVD) method, cyclic-CVD method or an atomic layer deposition (ALD) method.

15. The method of claim 13, wherein adjusting a deposition pressure controls a composition of the phase change layer.

16. The method of claim 15, wherein the deposition pressure is in a range of 0.001 torr-10 torr.

17. The method of claim 13, wherein adjusting a deposition temperature controls a composition of the phase change layer.

18. The method of claim 17, wherein the deposition temperature is in a range of 150° C. to 350° C.

19. The method of claim 13, wherein a composition of the phase change layer is controlled by a flow rate of a reaction gas.

20. The method of claim 19, wherein the flow rate of the reaction gas is in an amount of 0-1 slm.

21. The method of claim 13, further comprising simultaneously supplying at least one of a second precursor including antimony (Sb) and a third precursor including tellurium (Te) with the first precursor.

22. The method of claim 13, further comprising purging the first precursor; and supplying at least one of a second precursor including antimony (Sb) and a third precursor including tellerium (Te).

23. A method of manufacturing a phase change memory device including a method of forming a phase change layer according to claim 12, comprising:

supplying a first precursor on a lower layer on which the phase change layer will be formed, wherein the phase change memory device includes a storage node having the phase change layer, and the first precursor is a Ge compound represented by one of Formulas (4) and (5):

FORMULA (4)

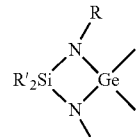

FORMULA (5)

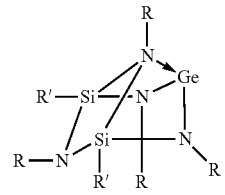

wherein R is at least one selected from the group consisting of hydrogen, alkyl group, allyl group, vinyl group, amino group, SiMe$_3$ and t-Bu, and R' is at least one selected from the group consisting of hydrogen, alkyl group, allyl group, vinyl group, amino group and methyl group.

* * * * *